(12) United States Patent
Hung

(10) Patent No.: US 6,208,077 B1
(45) Date of Patent: Mar. 27, 2001

(54) ORGANIC ELECTROLUMINESCENT DEVICE WITH A NON-CONDUCTIVE FLUOROCARBON POLYMER LAYER

(75) Inventor: Liang-Sun Hung, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/186,538

(22) Filed: Nov. 5, 1998

(51) Int. Cl.$^7$ ........................................................ H01J 1/62
(52) U.S. Cl. ............................ 313/506; 313/504; 428/690
(58) Field of Search .................................. 313/498, 501, 313/503, 504, 506, 507; 428/690, 917

(56) References Cited

U.S. PATENT DOCUMENTS

| | | |
|---|---|---|
| 3,180,730 | 4/1965 | Klupfel et al. . |
| 3,567,450 | 3/1971 | Brantly et al. . |
| 3,658,520 | 4/1972 | Brantly et al. . |
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 4,950,950 | 8/1990 | Perry et al. . |
| 5,047,687 | 9/1991 | VanSlyke . |
| 5,059,062 | 10/1991 | Bresnahan . |
| 5,059,861 | 10/1991 | Littman et al. . |
| 5,061,569 | 10/1991 | VanSlyke et al. . |
| 5,073,446 | 12/1991 | Scozzafava et al. . |
| 5,141,671 | 8/1992 | Bryan et al. . |
| 5,150,006 | 9/1992 | VanSlyke et al. . |
| 5,151,629 | 9/1992 | VanSlyke . |
| 5,677,572 | 10/1997 | Hung et al. . |
| 5,965,241 | * 10/1999 | Mehta ................................ 428/195 |
| 5,990,615 | * 11/1999 | Sakaguchi et al. .................. 313/504 |

OTHER PUBLICATIONS

"Organic electroluminescent devices with improved stability" by S.A. VanSlyke, C.H. Chen, and C.W. Tang, Applied Physics Letters, vol. 69, 2160 (1996).
Plasma Polymerization by H. Yasuda.

* cited by examiner

Primary Examiner—Nimeshkumar D. Patel
Assistant Examiner—Joseph Williams
(74) Attorney, Agent, or Firm—Raymond L. Owens

(57) ABSTRACT

A thin non-conductive fluorocarbon polymer layer is advantageously used in electroluminescent devices. The polymer is produced by plasma polymerization of a fluorocarbon gas in a RF plasma

18 Claims, 5 Drawing Sheets

ORGANIC ELECTROLUMINESCENT DEVICE WITH A NON-CONDUCTIVE FLUOROCARBON POLYMER LAYER

CROSS REFERENCE TO RELATED APPLICATIONS

Reference is made to related to U.S. application Ser. No. 09/186,829 filed concurrently herewith entitled "Conductive Fluorocarbon Polymer and Method Of Making Same" to Hung et al; and U.S. patent application Ser. No. 08/961,433 filed Oct. 30, 1997, entitled "A Multistructured Electrode for Use With Electroluminescent Devices" to Hung et al., the disclosures of which are incorporated herein by reference

FIELD OF THE INVENTION

This invention relates to organic electroluminescent devices. More particularly, this invention relates to devices which have a thin non-conductive fluorocarbon polymer layer disposed over an anode.

BACKGROUND OF THE INVENTION

Organic electroluminescent (EL) devices contain spaced electrodes separated by an organic light-emitting structure which emits light in response to the application of an electrical potential difference across the electrodes.

The basic form of the organic EL devices is a two-layer structure, in which one organic layer is specifically chosen to inject and transport holes and the other organic layer is specifically chosen to inject and transport electrons. The interface between the two layers provides an efficient site for hole-electron recombination and resultant electroluminescence. Examples are provided by U.S. Pat. Nos. 4,356,429; 4,539,507; 4,720,432; 4,885,211; 4,950,950; 5,047,687; 5,059,861; 5,061,569; 5,073,446; 5,141,671; 5,150,006 and 5,151,629.

The simple structure can be modified to a three-layer structure, in which an additional luminescent layer is introduced between the hole and electron transporting layers to function primarily as the site for hole-electron recombination and thus electroluminescence. In this respect, the functions of the individual organic layers are distinct and can therefore be optimized independently. For instance, the luminescent or recombination layer can be chosen to have a desirable EL color as well as a high luminance efficiency. Likewise, the electron and hole transport layers can be optimized primarily for the carrier transport property.

It is well known that operating voltage of the organic EL devices can be significantly reduced by using a low-work function cathode and a high-work function anode. The preferred cathodes are those constructed of a combination of a metal having a work function less than 4.0 eV and one having a work function greater than 4.0 eV, as disclosed by Tang et al in U.S. Pat. No. 4,885,211 and by VanSlyke et al in U.S. Pat. No. 5,059,062. The use of a LiF/Al bilayer to enhance electron injection in organic EL devices has also been disclosed by Hung et al in U.S. Pat. No. 5,677,572.

In organic EL devices, the anode is commonly formed of indium tin oxide (ITO) because of its transparency, good conductivity, and high work function. However, a light-emitting structure grown on a bare ITO surface generally shows poor current-voltage characteristics and low operational stability. The mitigation of these problems has involved introducing an intermediate layer between the ITO and the organic light-emitting structure. For instance, VanSlyke et al. demonstrated a highly stable organic device formed by using a multilayer structure with a CuPc-stabilized hole-injection contact. See "Organic electroluminescent devices with improved stability" by S. A. VanSlyke, C. H. Chen, and C. W. Tang, Applied Physics Letters, Vol. 69, 2160 (1996). However, the CuPc layer interposed between the ITO and a hole-transporting layer results in a substantial increase of the drive voltage because of a hole injection barrier present at the interface between the CuPc and the hole-transporting layer NPB.

Thin organic layers are generally formed by using spin coating or thermal evaporation. It was found recently that the layers can also be fabricated from organic vapors subjected to glow discharge. Cross-linked polymers are generated in plasma, and the process is usually called "plasma polymerization". The unique feature of plasma polymerization is the formation of a ultra-thin layer with a minimal amount of flaws. With respect to spin coating or vacuum deposition plasma polymerization provides layers with excellent conformality, sufficient durability, and improved adhesion.

Thin organic layers prepared by plasma polymerization at radio frequency (RF) are, in general, dielectric materials with insulating properties and extremely low conductivities. For tetrafluoroethylene polymerized by plasma, Vollman and Poll (see *Plasma Polymerization* by H. Yasuda) reported dc conductivity values in the range $10^{-17}$–$10^{-18}$ (ohm-cm)$^{-1}$. Hetzler and Kay (see *Plasma Polymerization* by H. Yasuda) reported ac conductivities between $10^{-15}$ and $10^{-10}$ (ohm-cm)$^{-1}$ measured at $10^{-3}$–$10^5$ Hz. For very low frequencies, however, the conductivity leveled off to the dc value at $10^{-17}$ (ohm-cm)$^{-1}$, which is in good agreement with Vollman and Poll's data. Because of the low conductivities, the materials are commonly used as dielectrics or corrosion protective coating.

SUMMARY OF THE INVENTION

It is an object of the invention to enhance hole injection and improve operational stability in organic EL devices.

The object is achieved in a device, in which a thin polymer layer, which is prepared by radio frequency (RF) plasma polymerization of a fluorocarbon gas, is deposited over an anode.

Quite unexpectedly, it has been found in this invention that the organic EL devices using such a thin polymer layer on an ITO anode exhibit enhanced hole injection and improved device operational stability regardless of its low conductivity.

The drawings are necessarily of a schematic nature, since the thicknesses of the individual layers are too thin, and thickness differences of the various elements too great to permit depiction to scale or to permit convenient proportionate scaling.

DESCRIPTION OF THE PREFERRED EMBODIMENTS

Before describing the organic electroluminescent devices of the invention, two configurations of prior art organic electroluminescent devices will be discussed.

Figure 1:
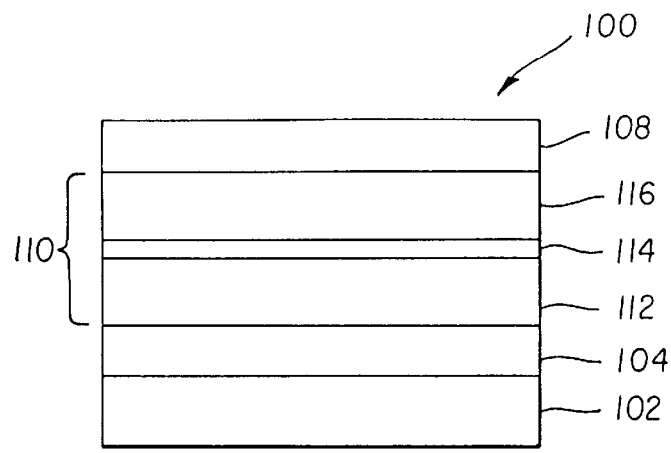
FIG. 1 is a schematic diagram of an organic electroluminescent device (prior art), in which a light-emitting structure is deposited on an ITO anode.

In FIG. 1, an organic electroluminescent device 100 has a substrate 102, on which is disposed an anode 104. An organic light-emitting structure 110 is formed between the anode 104 and a cathode 108. The organic light-emitting structure 110 is comprised of, in sequence, an organic hole-transporting layer 112, an organic light-emitting layer 114, and an organic electron-transporting layer 116. When an electrical potential difference is applied between the anode 104 and the cathode 108 such that the anode is electrically positive relative to the cathode, the cathode will inject electrons into the electron-transporting layer 116, and the electrons will traverse the electron-transporting layer 116 and the light-emitting layer 114. At the same time, holes will be injected from the anode 104 into the hole-transporting layer 112, and the holes will migrate across layer 112, and eventually recombine with electrons near the interface between the hole-transporting layer 112 and the light-emitting layer 114. When a migrating electron drops from its conduction band to a valance band in filling a hole, energy is released as light, which is emitted through the light-transmissive anode 104 and substrate 102 for viewing by an observer.

Figure 2:
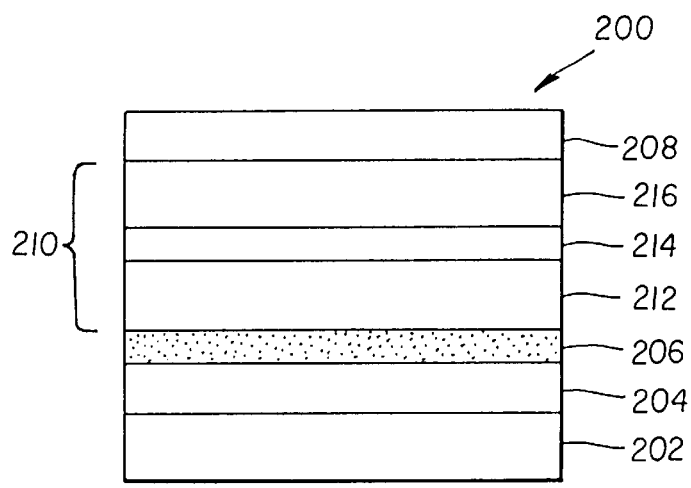
FIG. 2 is a schematic diagram of an organic electroluminescent device (prior art), in which a light-emitting structure is deposited over an ITO anode, and a CuPc layer is interposed between the light-emitting structure and the ITO anode.

In FIG. 2 is shown another prior art organic electroluminescent device 200, in which a CuPc layer is interposed between the ITO anode 204 and the hole-transporting layer 212. The organic light-emitting structure 210 and its organic layers 212, 214, and 216 are corresponding to the respective elements 110, 112, 114, and 116 of FIG. 1. Accordingly, their construction and function require no further description.

Figure 3:
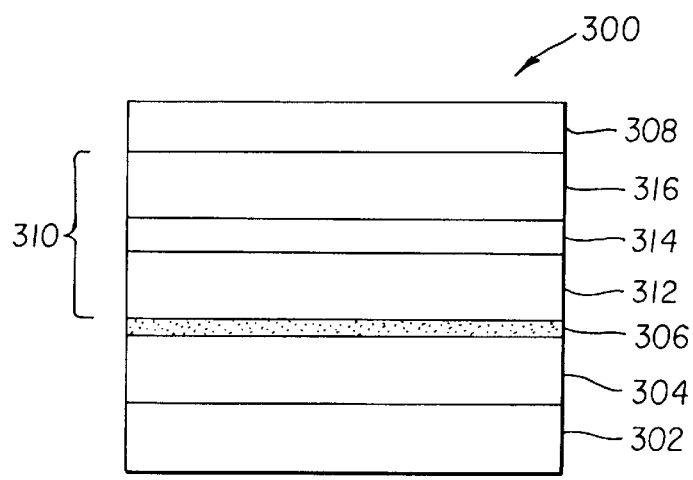
FIG. 3 is a schematic diagram of an organic electroluminescent device (present invention), in which a light-emitting structure is deposited over an ITO anode, and a fluorocarbon polymer layer is interposed between the light-emitting structure and the ITO anode.

In FIG. 3, an organic electroluminescent device 300 is illustrative which is formed in accordance with the present invention. Here an organic electroluminescent device 300 has a substrate 302, on which is disposed an anode 304. An organic light-emitting structure 310 is formed between the anode 304 and a cathode 308. The organic light-emitting structure 310 is comprised of, in sequence, an organic hole-transporting layer 312, an organic light-emitting layer 314, and an organic electron-transporting layer 316. The structure is distinct over the prior art of FIGS. 1 and 2. Here a thin polymer layer 306 is interposed between the ITO anode 304 and the hole-transporting layer 312. The polymer layer is prepared by plasma polymerization of a fluorocarbon gas in a RF plasma.

The substrate 302 are electrically insulated and can either be light transmissive or opaque. The light transmissive property is desirable for viewing the EL emission through the substrate. For applications where the EL emission is viewed through the top electrode, the transmissive characteristic of the support is immaterial, and therefore any appropriate substrate such as opaque semiconductor and ceramic wafers can be used. Of course, it is necessary to provide in these device configurations a light transparent top electrode.

The anode 304 is formed of a conductive and transmissive layer. The light transparent property of the anode 304 is desirable for viewing the EL emission through the substrate. For applications where the EL emission is viewed through the top electrode, the transmissive characteristic of the layer 304 is immaterial, and therefore any appropriate materials such as metals or metal compounds having a work function greater than 4.1 eV can be used. The metal includes gold, iridium, molybdenum, palladium, and platinum. The conductive and transmissive layer can be selected from the group of metal oxides, nitrides such as gallium nitride, selenides such as zinc selenide, and sulphides such as zinc sulphide. The suitable metal oxides include indium-tin oxide, aluminum- or indium-doped zinc oxide, tin oxide, magnesium-indium oxide, nickel-tungsten oxide, and cadmium-tin oxide.

After formation of the conductive anode, a polymer layer 306 is formed on the conductive anode 304. This polymer layer is an essential part in this invention. The fluorocarbon polymer is a teflon-like polymer and is substantially formed of carbon and fluorine. It may also contain hydrogen and/or a small amount of impurities such as nitrogen, oxygen, etc. The thickness of the polymer layer is so selected that it would have a full coverage on the underlying conductive layer, and that its low conductivity has no negative impacts on device performance. A useful range of the thickness is from 0.2 to 3 nm, preferably 0.4–1 nm.

The surface of the aforementioned conductive layer my be processed beforehand to improve its adhesion to the fluorocarbon overcoating layer. The types of processing include sputtering processing, corona processing, UV irradiation, or oxygen plasma treatment.

The fluorocarbon layers can be prepared in a reactor by plasma polymerization of a fluorocarbon gas with a ratio of fluorine to carbon close to 2. The gas can be selected from the group of $C_3F_8$, $C_4F_{10}$, $CHF_3$, $C_2F_4$, and $C_4F_8$. The plasma is generated by applying a RF input signal at appropriate power levels to the reactor. In most cases, a frequency of 13.6 MHz is preferred.

The polymerization is carried at 20–80° C. The actual temperature is largely dependent on operational parameters such as power and deposition time. The resulting polymer layers can be further processed to improve or alter their properties. For instance, the polymer layers can be annealed in various ambient or subjected to another radiation process such as ion implantation or an additional exposure to a plasma using oxygen, nitrogen or hydrogen.

The composition of the light-emitting structure is described as follows, with reference to device structure 300.

The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

The luminescent layer of the organic EL device comprises of a luminescent or fluorescent material, where electroluminescence is produced as a result of electron-hole pair recombination in this region. In the simplest construction, the luminescent layer comprises of a single component, that is a pure material with a high fluorescent efficiency. A well known material is tris (8-quinolinato) aluminum, (Alq), which produces excellent green electroluminescence. A preferred embodiment of the luminescent layer comprises a multi-component material consisting of a host material doped with one or more components of fluorescent dyes. Using this method, highly efficient EL devices can be constructed. Simultaneously, the color of the EL devices can be tuned by using fluorescent dyes of different emission wavelengths in a common host material. This dopant scheme has been described in considerable details for EL devices using Alq as the host material by Tang et al in U.S. Pat. No. 4,769,292.

Preferred materials for use in forming the electron transporting layer of the organic EL devices of this invention are metal chelated oxinoid compounds, including chelates of oxine itself (also commonly referred to as 8-quinolinol or 8-hydroxyquinoline). Such compounds exhibit both high levels of performance and are readily fabricated in the form of thin layers.

The organic EL devices of this invention can employ a cathode constructed of any metal having a work function lower than 4.0 eV, such as calcium and lithium. The cathode can also be formed through alloying a low work function metal with a high work function metal. A bilayer structure of Al/LiF can also been used to enhance electron injection, as disclosed in U.S. Pat. No. 5,677,572 by Hung et al.

The insulating polymer prepared by plasma polymerization of a fluorocarbon gas can have applications in other electroluminescent devices. One of the potential applications is the use of such films in polymer light-emitting diodes.

Preparation of Fluorocarbon Polymer

Plasma polymerization was carried out in a parallel plate reactor with $CHF_3$ at 350 mTorr and 200 W of power. An input electric power at 13.6 MHz was applied to two electrodes of the reactor through a matching network. A fluorocarbon polymer layer with a thickness of about 30 nm was deposited on an indium-tin oxide coated glass substrate and analyzed with x-ray photoelectron spectroscopy (XPS). Several peaks corresponding to C—CF, CF, $CF_2$, and $CF_3$ were observed from the polymer layer. For device applications, a much thinner polymer layer with a thickness of 0.2–3 nm was used.

EXAMPLES

The following examples are presented for a further understanding of the invention. For purposes of brevity, the materials and the layers formed therefrom will be abbreviated as given below:

ITO: indium tin oxide (anode)
CuPc: copper phthalocyanine (cathode buffer layer; and a hole-injecting layer disposed over the anode)
NPB: 4,4'-bis-[N-(1-naphthyl)-N-phenylamino]-bi-phenyl (hole-transporting layer)
Alq: tris (8-quinolinolato-N1, 08)-aluminum (electron-transporting layer; functioning here as a combined light-emitting layer and electron-transporting layer)
MgAg: magnesium:silver at a ratio of 10:1 by volume (cathode)

Example 1

An organic light-emitting structure as a prior art was constructed in the following manner:
  a) a light-transmissive anode of ITO-coated glass was ultrasonicated in a commercial detergent, rinsed in deionized water, degreased in toluene vapor, and subjected to an oxygen plasma for 3 min;
  b) a 60 nm thick NPB hole-transporting layer was deposited on the ITO layer by conventional thermal vapor deposition;
  c) a 75 nm thick Alq electron-transporting and light-emitting layer was deposited on the NPB layer by conventional thermal vapor deposition;
  d) a 200 nm thick MgAg layer was deposited on the Alq layer by co-evaporation from two sources (Mg and Ag).

Example 2

An organic light-emitting structure as a prior art was constructed in the following manner:
  a) a light-transmissive anode of ITO-coated glass was ultrasonicated in a commercial detergent, rinsed in deionized water, degreased in toluene vapor, and subjected to an oxygen plasma for 3 min;
  b) a 15 nm thick CuPc layer was deposited on the ITO layer by conventional thermal vapor deposition;
  c) a 60 nm thick NPB hole-transporting layer was deposited on the CuPc layer by conventional thermal vapor deposition;
  d) a 75 nm thick Alq electron-transporting and light-emitting layer was deposited on the NPB layer by conventional thermal vapor deposition;
  e) a 200 nm thick MgAg layer was deposited on the Alq layer by co-evaporation from two sources (Mg and Ag).

Example 3

An organic light-emitting structure was constructed in the following manner:
  a) a light-transmissive anode of ITO-coated glass was ultrasonicated in a commercial detergent, rinsed in deionized water, degreased in toluene vapor, and subjected to an oxygen plasma for 3 min;
  b) a 30 nm thick polymer layer was deposited on the ITO layer by plasma polymerization of a $CHF_3$ gas in a 13.6 MHz plasma;
  c) a 60 nm thick NPB hole-transporting layer was deposited on the polymer layer by conventional thermal vapor deposition;
  d) a 75 nm thick Alq electron-transporting and light-emitting layer was deposited on the NPB layer by conventional thermal vapor deposition.
  e) a 200 nm thick MgAg layer was deposited on the Alq layer by co-evaporation from two sources (Mg and Ag).

Example 4

An organic light-emitting structure according to this invention was constructed in the following manner:
  a) a light-transmissive anode of ITO-coated glass was ultrasonicated in a commercial detergent, rinsed in deionized water, degreased in toluene vapor, and subjected to an oxygen plasma for 3 min;

b) a 0.5–1.0 nm thick polymer layer was deposited on the ITO layer by plasma polymerization of a $CHF_3$ gas in a RF plasma;

c) a 60 nm thick NPB hole-transporting layer was deposited on the polymer layer by conventional thermal vapor deposition;

d) a 75 nm thick Alq electron-transporting and light-emitting layer was deposited on the NPB layer by conventional thermal vapor deposition.

e) a 200 nm thick MgAg layer was deposited on the Alq layer by co-evaporation from two sources (Mg and Ag).

Example 5

An organic light-emitting structure according to this invention was constructed in the following manner, which is similar to Example 1 except for ITO treatment:

a) a light-transmissive anode of ITO-coated glass was ultrasonicated in a commercial detergent, rinsed in deionized water, and degreased in toluene vapor;

b) a 60 nm NPB hole-transporting layer was deposited on the ITO anode by conventional thermal evaporation;

c) a 75 nm thick Alq electron-transporting and light-emitting layer was deposited on the NPB layer by conventional thermal vapor deposition.

d) a 200 nm thick MgAg layer was deposited on the Alq layer by co-evaporation from two sources (Mg and Ag).

Example 6

An organic light-emitting structure according to this invention was constructed in the following manner, which is similar to Example 4 except for ITO treatment:

a) a light-transmissive anode of ITO-coated glass was ultrasonicated in a commercial detergent, rinsed in deionized water, and degreased in toluene vapor;

b) a 0.5–1.0 nm thick polymer layer was deposited on the ITO layer by plasma polymerization of a $CHF_3$ gas in a 13.6 MHz plasma;

c) a 60 nm NPB hole-transporting layer was deposited on the polymer layer by conventional thermal evaporation;

d) a 75 nm thick Alq electron-transporting and light-emitting layer was deposited on the NPB layer by conventional thermal vapor deposition.

e) a 200 nm thick MgAg layer was deposited on the Alq layer by co-evaporation from two sources (Mg and Ag).

Each of the devices was tested by applying a drive voltage between the anode and the cathode. A current-drive voltage relationship was determined, as shown in FIGS. 4 and 5; a relationship between EL output and drive current was measured, as shown in FIG. 6; and operational stability of devices was characterized, as shown in FIG. 7.

Figure 4:
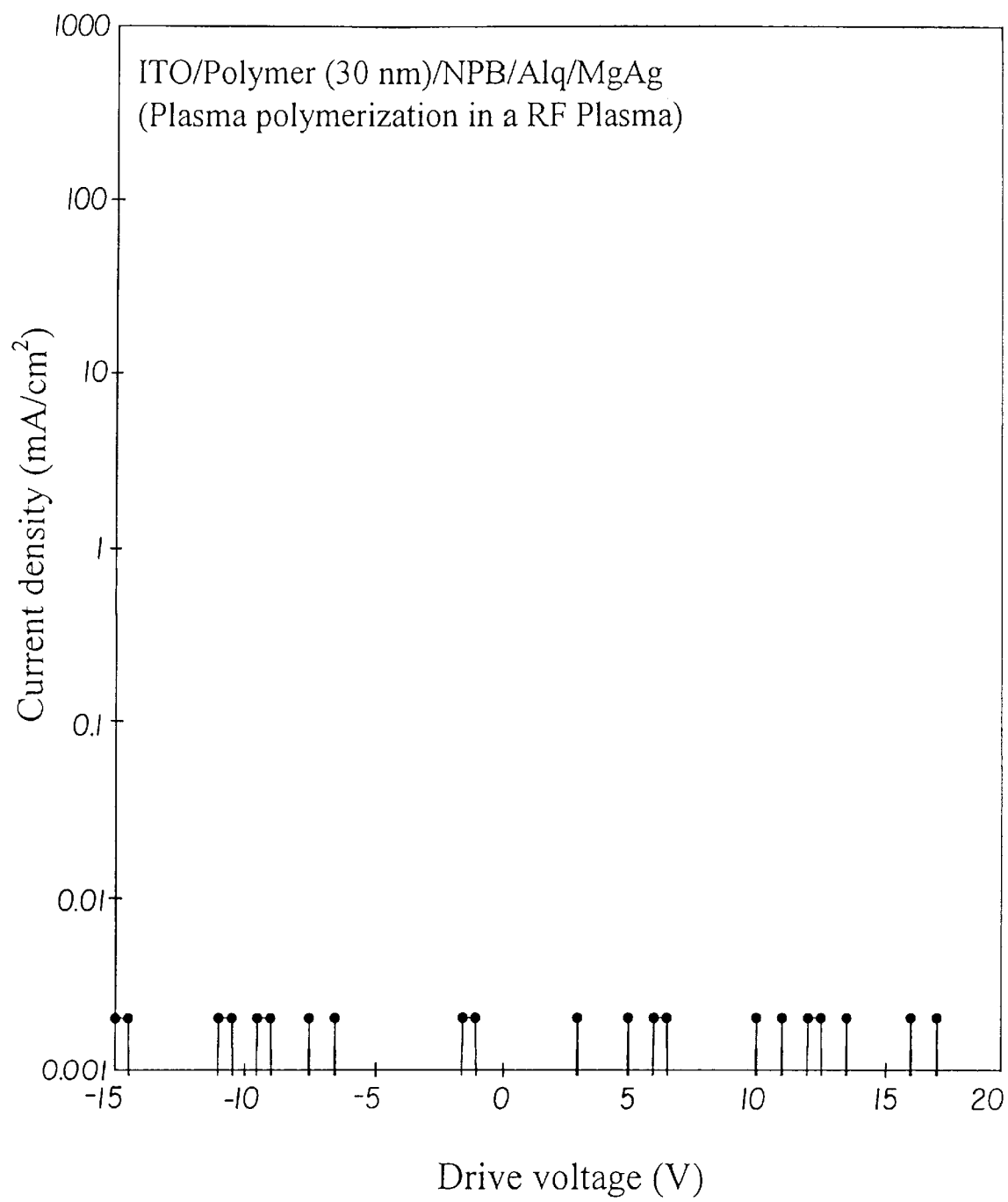
FIG. 4 shows in graphic form the current-voltage relationships of the organic EL device described in FIG. 3, in which a 30 nm thick polymer layer was used.

In FIG. 4 the current density of the devices described in Example 3 is plotted as a function of drive voltage. No current is seen in the plot, even the drive voltage was increased to 20 V. It is thus concluded that the polymer layers generated by plasma polymerization of a fluorocarbon gas in a RF plasma is insulating with extremely low conductivities.

Figure 5:
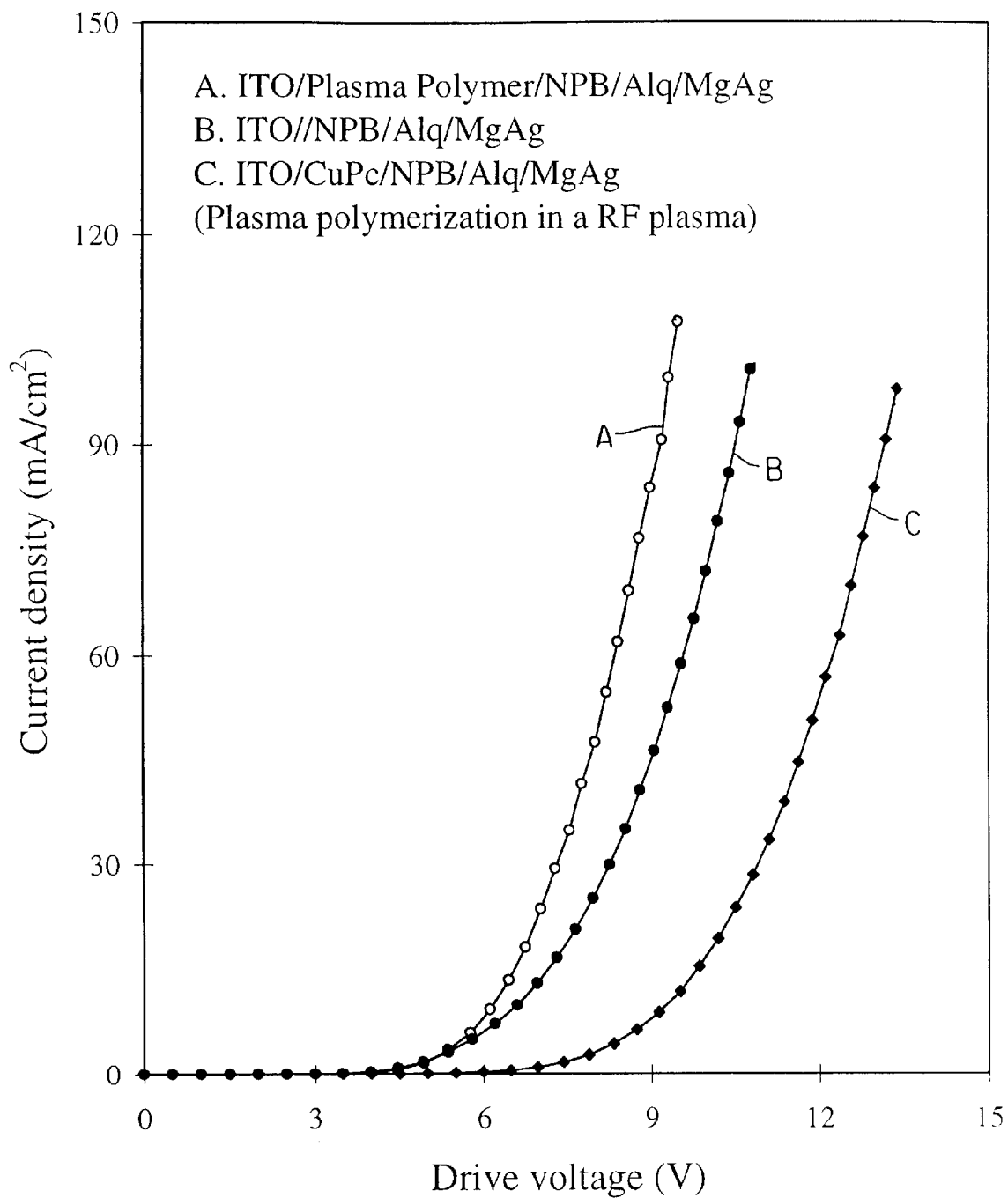
FIG. 5 shows in graphic form the current-voltage relationships of the organic EL devices described in FIGS. 1, 2 and 3, in which a 0.5–1 nm thick polymer layer was used.

In FIG. 5 the current density of the devices described in Examples 1, 2, and 4 is plotted as a function of drive voltage. It is seen from the figure that when a 0.5–1 nm thick plasma polymer layer was interposed between the ITO anode and the hole-transporting layer NPB, the devices show a fast rising I-V curve and a low operation drive voltage, as compared to those obtained from devices of Examples 1 and 2.

Figure 6:
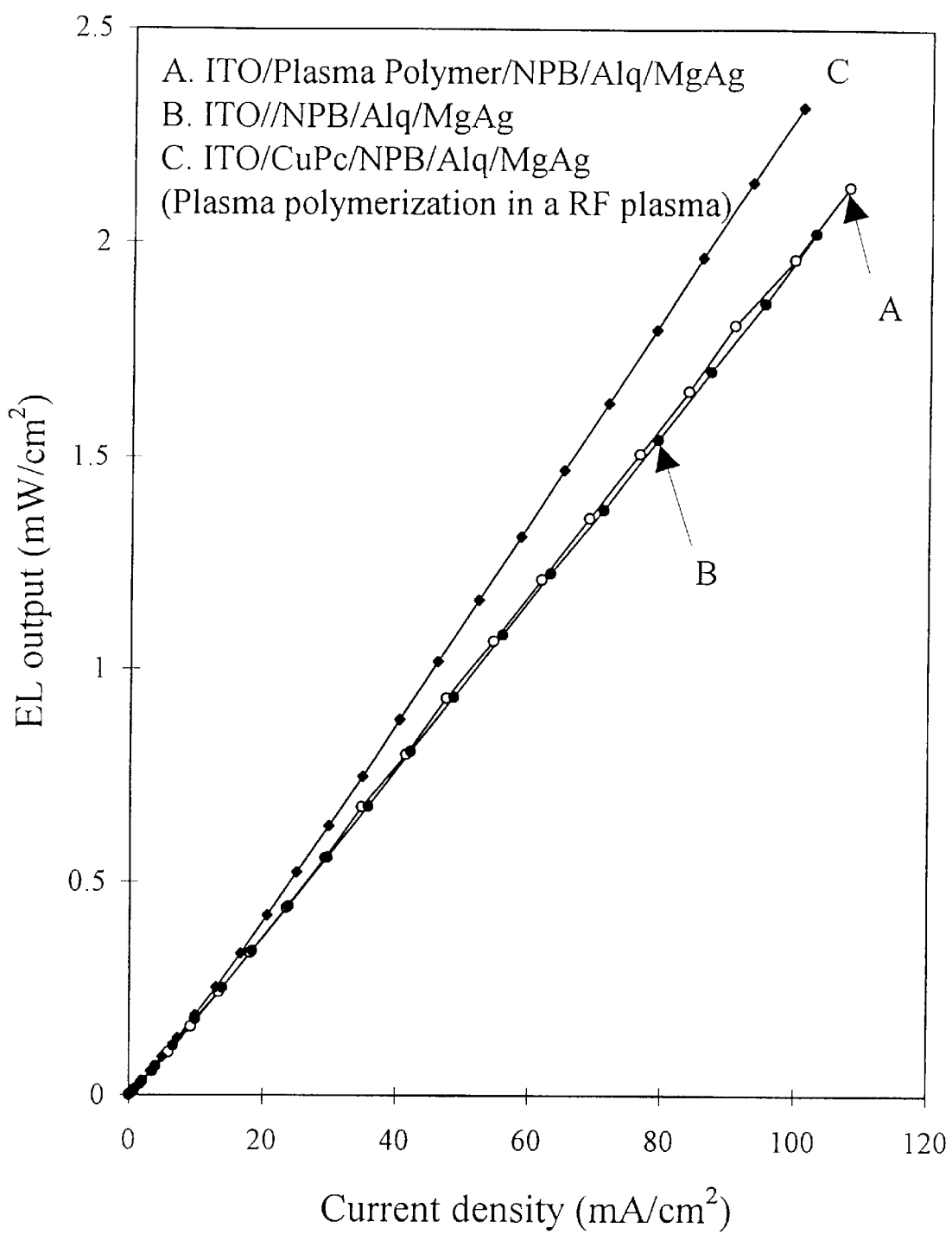
FIG. 6 shows in graphic form the EL output-current relationship for the organic EL devices described in FIGS. 1, 2 and 3, in which a 0.5–1 nm thick polymer layer was used.
Figure 7:
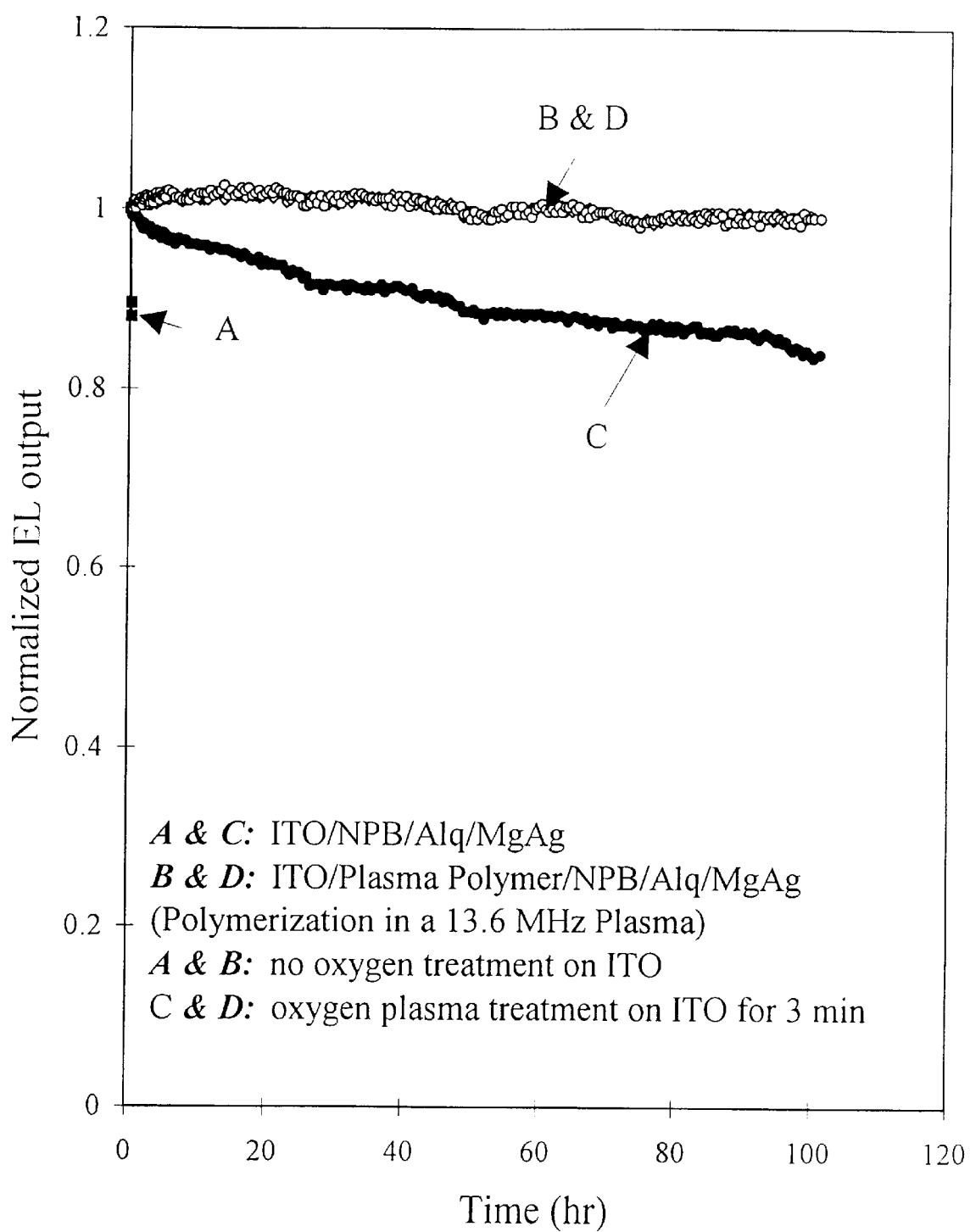
FIG. 7 shows in graphic form EL output as a function of operation time for the organic EL devices described in FIGS. 1, 2 and 3, in which a 0.5–1 nm thick polymer layer was used. The device processing is similar to that of FIG. 6 except for ITO-treatment.

In FIG. 6 the EL output of the devices described in Examples 1, 2, and 4 is plotted as a function of current density. It is seen from the figure, that the quantum efficiency determined from the device of Example 4 is comparable to that from the device of Example 1.

FIG. 7 shows operational stability measured on the devices of Examples 1, 4, 5, and 6. All the devices were tested at a constant current of 20 $mA/cm^2$, and the EL output was monitored. The devices of Examples 4 and 6 with a 0.5–1 nm polymer layer showed a superior operational stability over the devices of Examples 1 and 5. Moreover, extremely poor stability was measured on the device of Example 5 with a 15% drop of its EL output after 0.2 hours, while the drop determined from the device of Example 6 is merely 1% after operation for 100 hours. The EL output of the device of Example 1 was decreased to 85% of its initial value, while the decay from the device of Example 4 is barely detectable. All the results indicate that an extra-thin plasma polymerized fluorocarbon layer on ITO can significantly improve device stability and ease ITO treatment.

The invention has been described in detail with particular reference to certain preferred embodiments thereof, but it will be understood that variations and modifications can be effected within the spirit and scope of the invention.

| PARTS LIST | |
|---|---|
| 100 | organic electroluminescent device |
| 102 | substrate |
| 104 | anode |
| 108 | cathode |
| 110 | organic light-emitting structure |
| 112 | hole-transporting layer |
| 114 | light-emitting layer |
| 116 | electron-transporting layer |
| 200 | organic electroluminescent device |
| 202 | substrate |
| 204 | anode |
| 206 | CuPc layer |
| 208 | cathode |
| 210 | organic light-emitting structure |
| 212 | hole-transporting layer |
| 214 | light-emitting layer |
| 216 | electron-transporting layer |
| 300 | organic electroluminescent device |
| 302 | substrate |
| 304 | anode |
| 306 | plasma polymer layer |
| 308 | cathode |
| 310 | organic light-emitting structure |
| 312 | hole-transporting layer |
| 314 | light-emitting layer |
| 316 | electron-transporting layer |

What is claimed is:

1. An electroluminescent device comprising:

a) a substrate formed of an electrically insulating material which can be either an optically transparent material or an opaque material;

b) a conductive anode mounted over the substrate;

c) a thin polymer layer on the conductive anode prepared by RF plasma polymerization of a fluorocarbon gas wherein the thickness of the thin fluorocarbon layer is in a range of 0.2 to 3 nm;

d) an organic light-emitting structure formed over the polymer layer; and e) a cathode formed over the organic light-emitting structure.

2. The electroluminescent device of claim 1 wherein when the substrate is optically transparent, it is formed from glass or plastic.

3. The electroluminescent device of claim 1 wherein when the substrate is opaque, it is formed from a ceramic or semiconducting material.

4. The electroluminescent device of claim 1 wherein the conductive anode is transmissive and selected from the group consisting of a metal oxide, gallium nitride, zinc selenide, and zinc sulphide.

5. The electroluminescent device of claim 1 wherein the conductive anode is opaque and selected from the group consisting of a metal and a metallic compound having a work function greater than 4.1 eV.

6. The electroluminescent device of claim 4 wherein the metal oxide includes indium-tin oxide, aluminum- or indium-doped zinc oxide, tin oxide, magnesium-indium oxide, nickel-tungsten oxide, and cadmium-tin oxide.

7. The electroluminescent device of claim 5 wherein the metal includes gold, iridium, palladium, and platinum.

8. The electroluminescent device of claim 1 wherein the thickness of the fluorocarbon polymer layer is in the range of 0.4 to 1.0 nm.

9. The electroluminescent device of claim 1 wherein the fluorocarbon gas has a ratio of fluorine to carbon close to 2.

10. The electroluminescent device of claim 9 wherein the fluorocarbon gas is selected from the group of gases consisting of $C_3F_8$, $C_4F_{10}$, $CHF_3$, $C_2F_4$, and $C_4F_8$.

11. The electroluminescent device of claim 1 wherein the plasma is generated by an input electric signal at 13.6 MHz.

12. The electroluminescent device of claim 1 wherein the organic light-emitting structure is formed of polymer materials and small-molecule organic materials.

13. The electroluminescent device of claim 1 wherein the organic light-emitting structure includes:

(i) an organic hole-transporting layer formed over the polymer layer;

(ii) an organic light-emitting layer formed over the hole-transporting layer; and (iii) an organic electron-transporting layer formed over the light-emitting layer.

14. The electroluminescent device of claim 13 wherein the organic hole-transporting layer is formed of a material including hole-transporting aromatic tertiary amine molecules.

15. The electroluminescent device of claim 13 wherein the organic light-emitting layer is formed of a light-emitting host material selected from the group consisting of metal chelated oxinoid compounds.

16. The electroluminescent device of claim 13 wherein the organic light-emitting layer further includes at least one dye capable of emitting light when dispersed in the light-emitting host material.

17. The organic electroluminescent device of claim 13 wherein the electron-transporting layer is formed of a material selected from the group consisting of metal chelated oxinoid compounds.

18. The organic electroluminescent device of claim 1 wherein the cathode material is selected to have a work function less than 4.0 eV.

* * * * *